United States Patent [19]

Miyoshi et al.

[11] 4,008,485
[45] Feb. 15, 1977

[54] GALLIUM ARSENIDE INFRARED LIGHT EMITTING DIODE

[75] Inventors: Tadahiko Miyoshi, Hitachi; Yasutoshi Kurihara, Katsuta; Mitsuru Ura, Hitachi, all of Japan

[73] Assignee: Hitachi, Ltd., Japan

[22] Filed: June 20, 1975

[21] Appl. No.: 588,833

[30] Foreign Application Priority Data

June 24, 1974   Japan ............... 49-71341

[52] U.S. Cl. .................... 357/17; 357/18; 357/63; 357/64; 148/171

[51] Int. Cl.² .......................... H01L 33/00

[58] Field of Search ............ 357/17, 63, 18, 19, 357/64; 148/171

[56] References Cited

UNITED STATES PATENTS

| | | | |
|---|---|---|---|
| 3,600,240 | 8/1971 | Rupprecht | 148/171 |
| 3,660,734 | 5/1972 | Sida | 317/235 R |
| 3,666,567 | 5/1972 | Hunsperger | 148/1.5 |
| 3,676,228 | 7/1972 | Sokuri | 148/171 |
| 3,715,245 | 2/1973 | Barnett | 148/171 |
| 3,941,624 | 3/1976 | Cho | 148/175 |

OTHER PUBLICATIONS

Sato et al., *Nat. Tech. Report*, vol. 18, No. 3 June 1972, pp. 249-258.

*Primary Examiner*—Martin H. Edlow
*Attorney, Agent, or Firm*—Craig & Antonelli

[57] ABSTRACT

A gallium arsenide infrared-light emitting diode in which an Si-doped p-type GaAs layer is formed on an Si-doped n-type GaAs layer which is performed on an n-type GaAs substrate doped with at least one selected from Sn, Se, Te and S.

14 Claims, 3 Drawing Figures

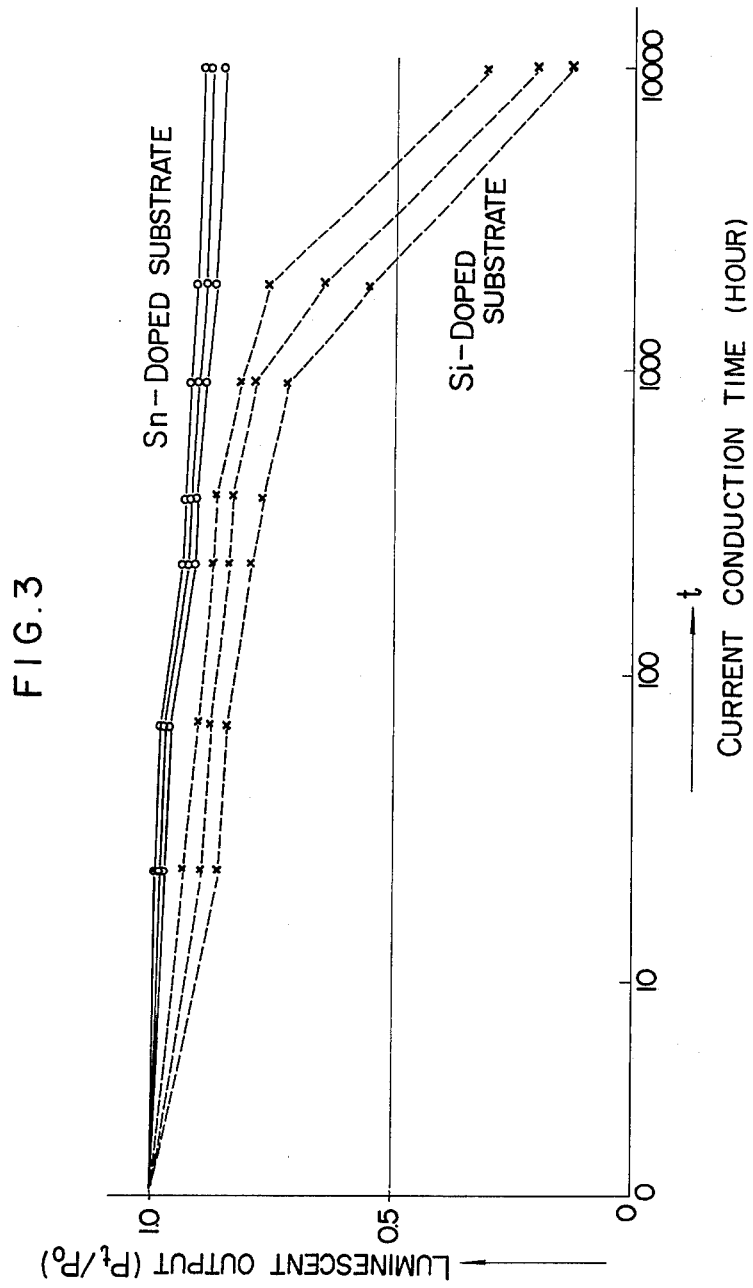

GALLIUM ARSENIDE INFRARED LIGHT EMITTING DIODE

BACKGROUND OF THE INVENTION

1. Field of the Invention

The present invention relates to a light emitting diode and more particularly to a gallium arsenide (GaAs) infrared-light emitting diode having a high luminescent efficiency.

2. Description of the Prior Art

A conventional GaAs infrared-light emitting diode having a high luminescent efficiency comprises an Si-doped n-type GaAs substrate, an Si-doped n-type GaAs layer formed on the substrate, an Si-doped p-type GaAs layer formed on the n-type GaAs layer to form a PN junction therebetween, and a pair of electrodes in ohmic contact with the substrate and the p-type GaAs layer.

Si atoms doped into the GaAs crystal give rise to a shallow acceptor level of 0.03eV and a deep acceptor level of 0.1eV. When the PN junction of such a GaAs infrared-light emitting diode as described above is forwardly biassed, the infrared radiation associated with the deep acceptor level takes place in the p-type GaAs layer.

A relatively high luminescent efficiency of 3 – 4 % can be obtained by taking the infrared radiation from the side of the n-type GaAs substrate whose infrared absorption coefficient is smaller than that of the p-type GaAs layer.

The reason why the GaAs infrared-light emitting diode having such a structure as described above is usually used, is as follows.

1. Since the energy of the infrared radiation associated with the deep acceptor level of 0.1eV is much smaller than the band-gap energy of GaAs, the amount of the absorption of the infrared light by the GaAs layer is relatively small so that a large luminescent output can be obtained.

2. Si atoms serve as amphoteric impurity to Ga and As. Therefore, if the temperature during liquid phase growth is high Si atoms are located in lattice points of Ga atoms to serve as donors, while at low temperature Si atoms are located in lattice points of As atoms to serve as acceptors. Accordingly, by utilizing this amphoteric property, both p-type and n-type layers can be formed in a single process of liquid phase growth so that the fabrication process can be facilitated and that a PN junction with excellent crystallization can be obtained. In other words, the luminescent efficiency can be improved.

A conventional GaAs light-emitting diode consisting only of Si-doped GaAs layers, however, has such drawbacks as follows, which degrade the luminescent efficiency.

1. Since Si atoms serve as amphoteric impurity in GaAs, the Si-doped GaAs crystal, no matter what type, p or n, formed through liquid phase growth becomes a compensated region. This is conjectured from the fact that the mobility of carriers in the resultant Si-doped GaAs crystal is smaller than that in an Sn-doped GaAs crystal or a Te-doped GaAs crystal, having the same carrier concentration as the Si-doped GaAs crystal, and is also manifest from the fact that the acceptor levels of 0.03eV and 0.1eV can be observed through the measurement of photoluminescence. It is therefore considered that the S-doped n-type GaAs layer serves an an absorber of the infrared light emitted from the Si-doped p-type GaAs layer. According to the conventional fashion, the emitted light is taken from the side of the n-type GaAs layer since the Si-doped n-type GaAs layer has a smaller absorption coefficient than the Si-doped p-type GaAs layer.

2. In the conventionally used Si-doped GaAs substrate, Si atoms as dopants near and in the surface of the substrate are sometimes oxidized to produce $SiO_2$. The substance $SiO_2$ is thermally stable and cannot be reduced to Si but remains as $SiO_2$ under an ordinary condition required in the liquid phase growth of GaAs (at temperatures below 1000° C in an atmosphere of $H_2$). Consequently, the wettability of Ga solution with respect to the substrate becomes poor so that the grown crystal becomes uneven or that the uniformity of the epitaxially grown crystal is degraded due to $SiO_2$ being contained in the crystal.

In order to eliminate the above drawbacks and therefore to improve the luminescent efficiency of the GaAs infrared-light emitting diode, it is necessary to substitute for the conventional Si-doped p-type GaAs layer a p-type $Ga_{1-x}Al_xAs$ layer which has wider band gaps than GaAs and which has a small absorption coefficient with respect to the light emitted from the GaAs, and to take out the light through the $Ga_{1-x}Al_xAs$ layer. A diode having such a structure as to embody this requirement has been proposed. In the fabrication process of such a diode, however, the $Ga_{1-x}Al_xAs$ layer must be formed on the GaAs layer through heterogenous epitaxial growth so that two steps of epitaxial growth are needed. Moreover, the manipulation of growing the three-element system is complicated, thus rendering the yield poor and rendering the completed diode expensive.

SUMMARY OF THE INVENTION

One object of the present invention is to provide a GaAs infrared-light emitting diode having a high luminescent efficiency.

Another object of the present invention is to provide a GaAs infrared-light emitting diode whose fabrication is easy.

The GaAs infrared-light emitting diode according to the present invention is characterized in that an n-type GaAs crystal doped with at least one member selected from Sn, Se, S and Te is used as a substrate in place of the conventional Si-doped n-type GaAs substrate, the n-type GaAs crystal having a small absorption coefficient with respect to the infrared-light emitted from the Si-doped p-type GaAs layer.

BRIEF DESCRIPTION OF THE DRAWINGS

FIG. 3 shows luminescent output versus current conduction time characteristic curves taken for a GaAs infrared-light emitting diode according to the present invention and a conventional one.

DESCRIPTION OF THE PREFERRED EMBODIMENTS

Figure 1:
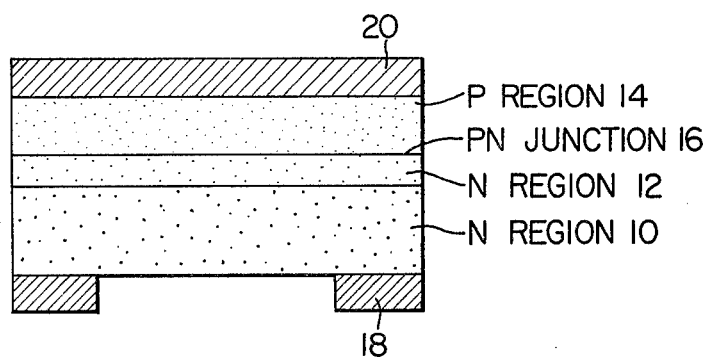
FIG. 1 shows in cross section a GaAs infrared-light emitting diode as an embodiment of the present invention.

The structure of a GaAs infrared-light emitting diode according to the present invention will be described with the aid of FIG. 1.

A GaAs infrared-light emitting diode according to the present invention comprises a GaAs substrate 10 doped with at least one impurity selected from Sn, Se, S and Te, an n-type GaAs layer 12 formed on the substrate 10, and a p-type GaAs layer 14 formed on the n-type GaAs layer 12. In the structure shown in FIG. 1, electrodes 18 and 20 are disposed in ohmic contact with the surfaces of the substrate 10 and the p-type GaAs substrate 14, the electrode 18 being located only on the peripheral portion of the surface of the substrate 10 so that emitted light can be easily taken out.

This GaAs infrared-light emitting diode with its luminescent output taken from the side of the n-type GaAs substrate 10, has a higher luminescent efficiency than the conventional GaAs infrared-light emitting diode consisting only of Si-doped GaAs layers. The reason is as follows.

1. Of the elements as impurities doped into the n-type GaAs substrate 10, Se, S or Te serves as an n-type impurity and forms no acceptor level in the substrate. On the other hand, Sn is an amphoteric impurity to GaAs and an Sn-doped GaAs crystal formed through liquid phase growth has a deep acceptor level of 0.2eV, as manifested by the experiment of photoluminescence. However, Sn has a lower tendency to form an acceptor level in GaAs than Si. Unlike the Si-doped GaAs, the Sn-doped GaAs is of n-type without exception. No example of a p-type Sn-doped GaAs has been reported. Accordingly, the number of the acceptors contained in a Sn-doped GaAs substrate formed through molten phase growth by which the dopant has a higher tendency to be of n-type than by liquid phase growth, is smaller than that of the acceptors in the Si-doped n-type GaAs substrate. Therefore, the GaAs crystal doped with at least one of Sn, Se, S and Te has a lower absorption coefficient with respect to the infrared light (about 9400 – 9700 A) emitted from the Si-doped p-type GaAs layer than the Si-doped GaAs crystal.

2. The oxides of Se, S and Te are easily evaporated under high temperatures while the oxide of Sn is easily reduced in the atmosphere of $H_2$ at high temperatures. Accordingly, under a normal condition of liquid phase growth, it never happens that the oxides of those elements are contained in the grown crystal and that the wettability of Ga solution with respect to the substrate becomes poor, as is often the case with the use of the Si-doped GaAs substrate. Therefore, the epitaxially grown crystal layer is more uniform on the GaAs substrate doped with Sn, Se, S or Te than on the GaAs substrate doped with Si. Thus, the resultant diode has a higher luminescent efficiency.

According to the present invention, the thickness of the p-type GaAs layer 14 is about 50 $\mu$ in view of carrier diffusion length since this layer serves as a luminescent region while the n-type GaAs substrate 10 is about 200 $\mu$ thick in view of convenience in handling. In order to reduce the amount of the internal absorption of infrared light, it is preferable to make the thickness of the n-type GaAs layer 12 as small as possible. If the n-type GaAs 12 is too thin, the uniformity of crystallization in the PN junction region becomes poor by the influence of the substrate whose uniformity of crystallization is usually lower than the epitaxially grown layer. Especially in the case as in the present invention, where a Si-doped p-type GaAs layer is directly grown on the GaAs substrate containing a dopant other than Si, the uniformity of crystallization in the PN junction region formed in the interface between the substrate and the epitaxial layer becomes poor. Therefore, the luminescent efficiency of the diode having such a structure is very low. In order to eliminate this drawback, an Si-doped n-type GaAs layer 12 as provided in the present invention is needed. The thickness of the layer 12 is preferably 5 – 20 $\mu$.

According to the present invention, the element Sn, Se, S or Te is used as dopant for the n-type substrate 10 in place of Si which is used in the prior art. Since the segregation coefficient of the element Se, S or Te with respect to GaAs is about ten times larger than that of Sn, the element Se, S or Te has a higher tendency to mix into the epitaxial layer during liquid phase growth than the element Sn. Moreover, in view of the fact justified by the experiment that a light-emitting diode using an Sn-doped GaAs substrate has a long life, it is concluded that Sn among the elements Se, S, Te and Sn is the most preferable as a dopant for the n-type GaAs substrate.

Se, S or Te heavily doped into GaAs exhibits a tendency to form a precipitant such as $Ga_2Se_2$, $Ga_2S_3$ or $Ga_2Te_3$ which absorbs the emitted infrared light. It is therefore necessary to limit the carrier concentration of the n-type GaAs substrate doped with Se, S or Te to $5 \times 10^{17} - 1 \times 10^{18}$ cm$^{-3}$. In the case where Sn is used as a dopant, the preferable carrier concentration is $5 \times 10^{17} - 3 \times 10^{18}$ cm$^{-3}$ since no precipitant such as $Sn_3As_2$ is formed below a concentration of about $3 \times 10^{18}$ cm$^{-3}$.

As described above, GaAs infrared-light emitting diode having a higher luminescent efficiency than a conventional one can be obtained by simply substituting for the conventional Si-doped n-type GaAs substrate formed through epitaxial growth, an n-type GaAs substrate doped with Sn, Se, S or Te formed in the same manner. In this case, more than one element of Sn, Se, S and Te may be used as dopants.

Now, the present invention will be described by way of embodiment below.

EMBODIMENT I

Figure 2:
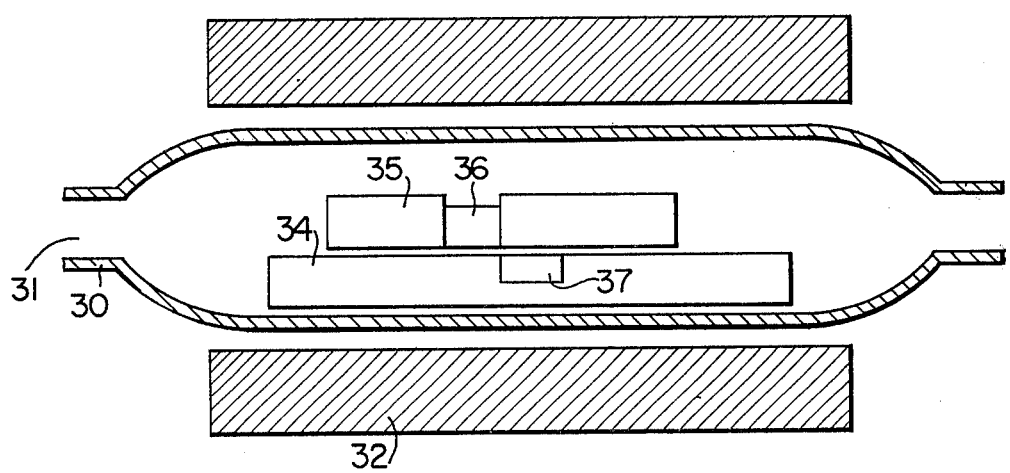
FIG. 2 schematically shows in cross section a liquid phase crystal growing apparatus used to fabricate a GaAs infrared-light emitting diode according to the present invention.

Through liquid phase growth, five kinds of n-type GaAs substrate doped respectively with Sn, S Se, Te and Si at a carrier concentration of $1 \times 10^{18}$ cm$^{-3}$, are prepared. Each substrate has dimensions of 20 mm $\times$ 15 mm $\times$ 0.4 mm and its principal surfaces have a direction indicated by (100). The substrate, after mechanical polishing thereof, is subjected to etching for five minutes in a solution containing sulfuric acid, hydrogen peroxide and water mixed in a ratio of 4 : 1 : 1. As shown in FIG. 2, a substrate 37 is rigidly mounted on a carbon block and a solution 36 containing Ga 20 g, GaAs 3.15 g and Si 0.10 g is retained in a carbon slider 35. All these members are placed in a reaction tube 30. This sytem is then heated up to 960° C in an electric furnace while $H_2$ gas is introduced at a speed of 1 l/min through a gas entrance port 31 so that GaAs and Si in the solution are completely molten. The temperature in the furnace is lowered at a rate of 1° C/min until the system is at 910° C. At that temperature, the carbon slider 35 is slid so as to bring the solution 36 in contact with the GaAs substrate 37. The system is further cooled down to 840° C and at that temperature the carbon slider 35 is slid so as to separate the solution from the GaAs substrate to finish the crystal growth. As a result, an Si-doped n-type GaAs layer 10 $\mu$ thick is formed on the n-type GaAs substrate and a Si-doped p-type GaAs layer 55 $\mu$ thick is epitaxially grown on the n-type GaAs layer 10 $\mu$ thick.

After slightly etching the surface of the thus prepared sample, the sample is hermetically contained in a quartz tube together with zinc arsenide and heated at 650° C for three hours so as to effect Zn diffusion. Then, the sample is polished on the side of n-type layer so as to have a thickness of 250 $\mu$ and the whole surface of the p-type layer has Au-ZN deposited through vacuum evaporation while Au-Ge-Ni in an area of 0.15 mm$\phi$ is deposited on the surface of the n-type substrate through vacuum evaporation using a mask. The thus processed sample is then scribed into dimensions of 0.5 × 0.5 mm and after the pellet has been bonded to a stem with the p-type layer downward, an Au wire is attached through thermocompression bonding to the electrode on the side of the p-type layer, to serve as a lead wire. The wavelength of the light emitted from the thus obtained light-emitting diode when a forward current of 100 mA is conducted therethrough, is about 9600 Å and the luminescent efficiency is 5.6 ± 0.5 % for the Sn-doped substrate, 5.3 ± 1.0 % for the S-, Se- and Te-doped substrates and 3.8 ± 0.4 % for the Si-doped substrate. The relatively large deviation of luminescent efficiency in the case of the S-, Se- and Te-doped substrates is supposed to be ascribed to the S, Se or Te atoms mixed in the spitaxial layer.

EMBODIMENT II

An Sn-doped GaAs substrate (carrier concentration $n = 1 \times 10^{18}$ cm$^{-3}$) is used to examine the influence of the variations in the concentration of GaAs in the Ga solution and the temperature in the crystal growth, upon the Si-doped n-type epitaxial layer. Table I given below shows the experimental conditions, the thicknesses of the epitaxial layers and the luminescent efficiencies of the corresponding light-emitting diodes. The untabulated conditions for the experiments and for the fabrication of the diodes are the same as those in Embodiment I.

ness is reduced to 2 $\mu$ (sample No. 2), there appears an influence by the substrate having a poor uniformity of crystallization so that the deviation of the luminescent efficiency becomes large. The luminescent efficiency in the case where the p-type epitaxial layer is directly grown on the substrate, is very low due to the influency by the substrate having a poor uniformity of crystallization (sample No. 1).

EMBODIMENT III

The experiment is performed under the same condition as in Embodiment I, with a sole exception of different carrier concentration in the GaAs substrate. Table II given below shows the kinds of dopants for the substrates, the carrier concentrations and the luminescent efficiencies of the corresponding light emitting diodes.

TABLE II

| No. | Dopant in n-type substrate | Carrier concentration in n-type substrate | Luminescent efficiency (%) |
|---|---|---|---|
| 7  | Sn | 5 × 10$^{18}$ cm$^{-3}$ | 4.7 ± 0.3 |
| 8  | Sn | 3 × 10$^{18}$ | 5.5 ± 0.4 |
| 9  | Sn | 1 × 10$^{18}$ | 5.6 ± 0.5 |
| 10 | Sn | 5 × 10$^{17}$ | 5.3 ± 0.5 |
| 11 | Sn | 1 × 10$^{17}$ | 4.4 ± 0.9 |
| 12 | Te | 5 × 10$^{18}$ | 4.7 ± 0.8 |
| 13 | Te | 1 × 10$^{18}$ | 5.3 ± 1.0 |
| 14 | Te | 5 × 10$^{17}$ | 5.1 ± 0.9 |
| 15 | Te | 1 × 10$^{17}$ | 4.5 ± 1.2 |

As seen in Table II, the luminescent efficiency is higher for the Sn-doped GaAs substrates having carrier concentrations of $3 \times 10^{18} - 5 \times 10^{17}$ cm$^{-3}$ and for the Te-doped GaAs substrates having carrier concentrations of $1 \times 10^{18} - 5 \times 10^{17}$ cm$^{-3}$. On the other hand, the luminescent efficiency is lower for the Sn-doped GaAs substrate having a carrier concentration of $5 \times 10^{18}$ cm$^{-3}$ (sample No. 7) and for the Te-doped GaAs substrate having a carrier concentration of $5 \times 10^{18}$ cm$^{-3}$ (sample No. 12), due to the influence by the precipitate in the substrates. The samples Nos. 11 and 15 have a low carrier concentration of $1 \times 10^{17}$ cm$^{-3}$ and therefore the contact resistances between the substrates and the associated electrodes are large so that the luminescent efficiency is lowered and that the deviation of the efficiency is also large. The results of the Table I

| No. | Quantity of GaAs in solution | Temperature at which solution is brought into contact with substrate | Temperature at which solution is separated from substrate | Thickness of n-type epitaxial layer | Thickness of p-type epitaxial layer | Luminescent efficiency (%) |
|---|---|---|---|---|---|---|
| 1 | 2.7 g  | 890° C | 825° C | 0 $\mu$  | 55 $\mu$ | 2.1 ± 1.0 |
| 2 | 2.95 g | 902°   | 840° C | 2 $\mu$  | 54 $\mu$ | 4.9 ± 0.9 |
| 3 | 3.0 g  | 905° C | 840° C | 5 $\mu$  | 53 $\mu$ | 5.2 ± 0.4 |
| 4 | 3.15 g | 910° C | 840° C | 10 $\mu$ | 55 $\mu$ | 5.6 ± 0.5 |
| 5 | 3.4 g  | 920° C | 840° C | 20 $\mu$ | 52 $\mu$ | 5.4 ± 0.3 |
| 6 | 4.0 g  | 940° C | 840° C | 50 $\mu$ | 55 $\mu$ | 4.5 ± 0.3 |

As seen from Table I, when the thickness of the n-type epitaxial layer is in a range of 5 - 20 $\mu$, the luminescent efficiency is higher and the deviation of the luminescent efficiency is smaller. On the other hand, if the thickness of the n-type epitaxial layer is increased up to 50 $\mu$ (sample No. 6), the layer becomes a compensated region so that the luminescent efficiency is lowered due to the influence by the n-type epitaxial layer having a large absorption coefficient. If the thick-experiments using S- and Se-doped GaAs substrates are the same as those of the experiments using the Te-doped GaAs substrates as shown in Table II.

EMBODIMENT IV

The experiment is performed, using an n-type GaAs substrate containing the Te and Se atoms in a ratio of 1 : 1 (carrier concentration = $1 \times 10^{18}$ cm$^{-3}$) and an Si-doped n-type GaAs substrate (carrier concentration = 3 × 10$^{18}$ cm$^{-3}$). The experimental condition here is almost the same as that in Embodiment I but the amount of Si contained in the Ga solution is 0.05 g in this case. The thicknesses of the n-and p-type epitaxial layers of each of the thus prepared samples are 20 $\mu$ and 45 $\mu$, respectively. Th wavelength of the lights emitted from the light emitting diodes obtained by using the samples, is 9400 A and the luminescent efficiency is 5.1 ± 0.8% for the sample using the Te and Se doped substrate and 3.8 ± 0.4% for the sample using the Si-doped substrate (forward current 100 mA).

EMBODIMENT V

Light emitting diodes are fabricated in the same manner as in Embodiment I. The changes of luminescent output with time are plotted by conducting a dc current of 200 mA through the light emitting diodes, the plot being shown in FIG. 3. As seen from FIG. 3, the luminescent outputs of the diodes using Sn-doped GaAs substrates vary by degrss in proportion to the logarithm of current conduction time and the half lives (time after which the luminescent output is reduced to a half of its initial value) are considered to be longer than ten thousand hours. On the other hand, the luminescent outputs of the diodes using Si-doped GaAs substrates fall abruptly from a current conduction time of about 1000 hours afterward and the half lives of these diodes at a conduction current of 200 mA (current density of 80 A/cm$^2$) are 2000 – 5000 hours. It can be concluded from the result obtained above that a light emitting iode using an Sn-doped GaAs substrate is more stable than a light emitting diode using an Si-doped GaAs substrate.

The reason why the life of the diode is prolonged has not yet been verified, but a certain hypothesis says that if a small amount of additive (in the present case Sn in the substrate) is mixed in the grown layer, the deterioration of the luminescent output can be prevented.

We claim:

1. A gallium arsenide light emitting diode comprising a semiconductor body with a pair of principal surfaces, said semiconductor body including (i) a first region of GaAs doped with at least one selected from the group consisting of Sn, Se, Te and S and having an n conductivity type, a first electrode being provided in ohmic contact with that surface of said first region which forms one of said principal surfaces of said semiconductor body, (ii) a second region of GaAs doped with Si and having an n conductivity type, said second region being disposed adjacent to said first region, and (iii) a third region of GaAs doped with Si and having a p conductivity type, said third region being disposed adjacent to said second region, a second electrode being provided in ohmic contact with that surface of said third region which forms the other principal surface of said semiconductor body.

2. A gallium aresenide light emitting diode as claimed in claim 1, wherein the thickness of said first region is about 200 $\mu$.

3. A gallium arsenide light emitting diode as claimed in claim 1, wherein the thickness of said second region is 5 – 20 $\mu$.

4. A gallium aresenide light emitting diode as claimed in claim 1, wherein the thickness of said third region is about 50 $\mu$.

5. A gallium arsenide light emitting diode comprising a semiconductor body with a pair of principal surfaces, said semiconductor body including (i) a first region of GaAs doped with Sn and having an n conductivity type, a first electrode being provided in ohmic contact with that surface of said first region which forms one of said principal surface of said semiconductor body, (ii) a second region of GaAs doped with Si and having an n conductivity type, said second region being disposed adjacent to said first region, and (iii) a third region of GaAs doped with Si and having a $p$ conductivity type, said third region being disposed adjacent to said second region, a second electrode being provided in ohmic contact with that surface of said third region which forms the other principal surface of said semiconductor body.

6. A gallium aresenide light emitting diode as claimed in claim 5, wherein the carrier concentration of Sn in said first region is 5 × 10$^{17}$ – 3 × 10$^{18}$ cm$^{-3}$.

7. A gallium arsenide light emitting diode as claimed in claim 6, wherein the thickness of said first region is about 200 $\mu$.

8. A gallium arsenide light emitting diode as claimed in claim 6, wherein the thickness of said second region is 5 – 20 $\mu$.

9. A gallium aresenide light emitting diode as claimed in claim 6, wherein the thickness of said third region is about 50 $\mu$.

10. A gallium arsenide light emitting diode comprising a semiconductor body with a pair of principal surfaces, said semiconductor body including (i) a first region of GaAs doped with at least one selected from the group consisting of Se, Te and S and having an n conductivity type, a first electrode being provided in ohmic contact with that surface of said first region which forms one of said principal surfaces of said semiconductor body, (ii) a second region of GaAs doped with Si and having an n conductivity type, said second region being adjacent to said first region, and (iii) a third region of GaAs doped with Si and having a p conductivity type, said third region being adjacent to said second region, a second electrode being provided in ohmic contact with that surface of said third region which forms the other principal surface of said semiconductor body.

11. A gallium arsenide light emitting diode as claimed in claim 10, wherein the carrier concentration of Se, S or Te in said first region is 5 × 10$^{17}$ – 1 × 10$^{18}$ cm$^{-3}$.

12. A gallium arsenide light emitting diode as claimed in claim 11, wherein the thickness of said first region is about 200 $\mu$.

13. A gallium arsenide light emitting diode as claimed in claim 11, wherein the thickness of said second region is 5 – 20 $\mu$.

14. A gallium arsenide light emitting diode as claimed in claim 11, wherein the thickness of said third region is about 50 $\mu$.

* * * * *